United States Patent
Ray et al.

(10) Patent No.: US 11,164,642 B1
(45) Date of Patent: Nov. 2, 2021

(54) SYSTEMS AND METHODS FOR HARDENING FLASH MEMORY TO RADIATION

(71) Applicants: Biswajit Ray, Huntsville, AL (US); Preeti Kumari, Huntsville, AL (US)

(72) Inventors: Biswajit Ray, Huntsville, AL (US); Preeti Kumari, Huntsville, AL (US)

(73) Assignee: Board of Trustees of the University of Alabama, For and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 16/273,062

(22) Filed: Feb. 11, 2019

Related U.S. Application Data

(60) Provisional application No. 62/628,604, filed on Feb. 9, 2018.

(51) Int. Cl.
G11C 16/34 (2006.01)
G06F 3/06 (2006.01)
G11C 16/16 (2006.01)

(52) U.S. Cl.
CPC ........ *G11C 16/3436* (2013.01); *G06F 3/0616* (2013.01); *G06F 3/0652* (2013.01); *G06F 3/0679* (2013.01); *G11C 16/16* (2013.01); *G11C 16/3495* (2013.01)

(58) Field of Classification Search
CPC . G11C 16/3436; G11C 16/16; G11C 16/3495; G06F 3/0616; G06F 3/0679; G06F 3/0652
See application file for complete search history.

(56) References Cited

U.S. PATENT DOCUMENTS

| | | | |
|---|---|---|---|
| 7,035,964 B1 | 4/2006 | Kohler | |
| 7,136,303 B2 | 11/2006 | Smith | |
| 7,491,948 B2 | 2/2009 | Gordon et al. | |
| 8,199,590 B1 | 6/2012 | Novosel | |
| 8,331,128 B1 | 12/2012 | Derhacobian | |
| 8,335,098 B2 | 12/2012 | Shen | |
| 8,861,250 B1 | 10/2014 | Wu | |
| 9,530,512 B2 | 12/2016 | Ray et al. | |
| 9,543,028 B2 | 1/2017 | Ray et al. | |
| 9,705,320 B1 | 7/2017 | Petrick | |
| 10,403,366 B1* | 9/2019 | Tabrizi | G11C 29/42 |
| 10,509,132 B1 | 12/2019 | Ray et al. | |
| 2004/0041197 A1 | 3/2004 | Jong et al. | |

(Continued)

OTHER PUBLICATIONS

Irom, et al, "Single Event Effect and Total Ionizing Dose Results of Highly Scaled Flash Memories," Radiation Effects Data Workshop (REDW), 2013 IEEE, pp. 1-4, Jul. 2013.

(Continued)

*Primary Examiner* — Sultana Begum
(74) *Attorney, Agent, or Firm* — Maynard Cooper & Gale, P. C.; Jon E. Holland

(57) ABSTRACT

A method for radiation hardening flash memory performs accelerated aging on the flash memory by program-erase (PE) cycling the flash memory. Such accelerated aging induces trap states in the tunnel oxide layer of the flash memory, which results in improved ionizing radiation tolerance. The number of cycles used to harden a given memory cell is optimally determined in order to limit effects of the radiation hardening on the reliability of the cell.

2 Claims, 5 Drawing Sheets

(56) References Cited

U.S. PATENT DOCUMENTS

| | | |
|---|---|---|
| 2004/0191989 A1 | 9/2004 | Ngo |
| 2006/0083060 A1 | 4/2006 | Riva Reggiori |
| 2008/0232162 A1 | 9/2008 | Kuan |
| 2010/0140488 A1 | 6/2010 | Visconti |
| 2010/0240156 A1* | 9/2010 | Suhail .................... G11C 29/06 438/17 |
| 2014/0026653 A1 | 1/2014 | Del Signore et al. |
| 2014/0098605 A1 | 4/2014 | Long |
| 2017/0110199 A1* | 4/2017 | Li .......................... G11C 29/44 |

OTHER PUBLICATIONS

Ray, et al., U.S. Appl. No. 16/415,588, entitled, "Systems and Methods for Sensing Radiation using Flash Memory," filed May 17, 2019.

Ray, U.S. Appl. No. 16/808,924, entitled, "Systems and Methods to Convert Memory to One-Time Programmable Memory," filed Mar. 4, 2020.

* cited by examiner

US 11,164,642 B1

SYSTEMS AND METHODS FOR HARDENING FLASH MEMORY TO RADIATION

CROSS REFERENCE TO RELATED APPLICATION

This application claims priority to U.S. Provisional Application No. 62/628,604, entitled "Accelerated Aging Induced Radiation Hardening of Flash Memory" and filed on Feb. 9, 2018, which is incorporated herein by reference.

RELATED ART

Radiation tolerance is an important reliability concern for space electronic systems, especially for nonvolatile memories (NVMs) as they store space mission critical data, codes for several operating systems, control data, and mass storage information. Failure of NVM, thus, can compromise space mission's success. Radiation-hard NVMs are reliable for space environment, but they have very limited capacity (in MB range), and very high cost making them impractical for several space applications that require larger storage capacities.

NAND flash memory is generally the most popular commercial nonvolatile memory (NVM) option due to its high density (>1 TB/sq. inch) along with its relatively low cost (<$1/GB), light weight and low power consumption, making it very attractive for space electronic systems. However, flash memory has several reliability issues related to ionizing radiation, which prevent its large-scale use in the space environment. Several studies have been made on the radiation effects of flash memory in the past few years that quantify the tolerance for total ionization dose (TID) and single event effects (SEEs). However, there are very few approaches available to make commercial NAND Flash memory radiation hard. Most of the radiation hardening approaches for commercial Flash are based on software and hardware redundancy techniques, which essentially compromise the memory density for increased reliability.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to systems and methods for hardening flash memory to radiation. In some embodiments of the present disclosure memory operations, such as program-erase (PE) cycling, are performed on a flash memory in order to induce accelerated aging, thereby hardening the flash memory to radiation.

In this regard, flash memory is generally a type of non-volatile semiconductor memory which stores information in the form of charge on its floating gate. Structurally, it comprises a floating gate metal-oxide-semiconductor field effect transistor (FG-MOSFET), which allows electrons from the silicon substrate to be tunneled into the floating gate during the program operation. Under ionizing radiation exposure, charge loss takes place from the floating gate of the flash cell through different mechanisms. As an example, charge loss can occur from each of the following mechanisms: (1) electron emission through the tunnel oxide and/or the blocking oxide, (2) trap assisted tunneling, (3) generation of "e-h pair" (electron-hole pair) in the tunnel oxide and/or the blocking oxide, and (4) conductive pipe model. For ionizing radiation, it is believed that the mechanism (3) is the dominant charge loss process, which is the radiation induced electron-hole pair generation in the MOS oxide and the subsequent hole transport to the negatively charged floating gate resulting in recombination of stored electrons. In this context, it is believed that electrons, being more mobile, escape the oxide immediately after generation, while holes are either trapped in the oxide or recombine with stored electrons on the floating gate. As a result, the floating gate loses its charge which lowers the programmed cells' threshold voltage (Vt) distribution resulting in failed bits in the memory array.

A radiation hardening technique for flash memory, such as commercial NAND flash memory, may be performed by cycling through a number of memory operations to accelerate aging of the memory. In one embodiment, accelerated aging is performed using controlled program-erase (PE) cycling on a fresh memory block. Experimental results demonstrate that such accelerated aging can improve radiation tolerance of the flash memory by more than 25%. It is believed that the accelerated aging, such as program-erase cycling, induces trap states in the tunnel oxides, which results in improved ionizing radiation tolerance.

Figure 1:
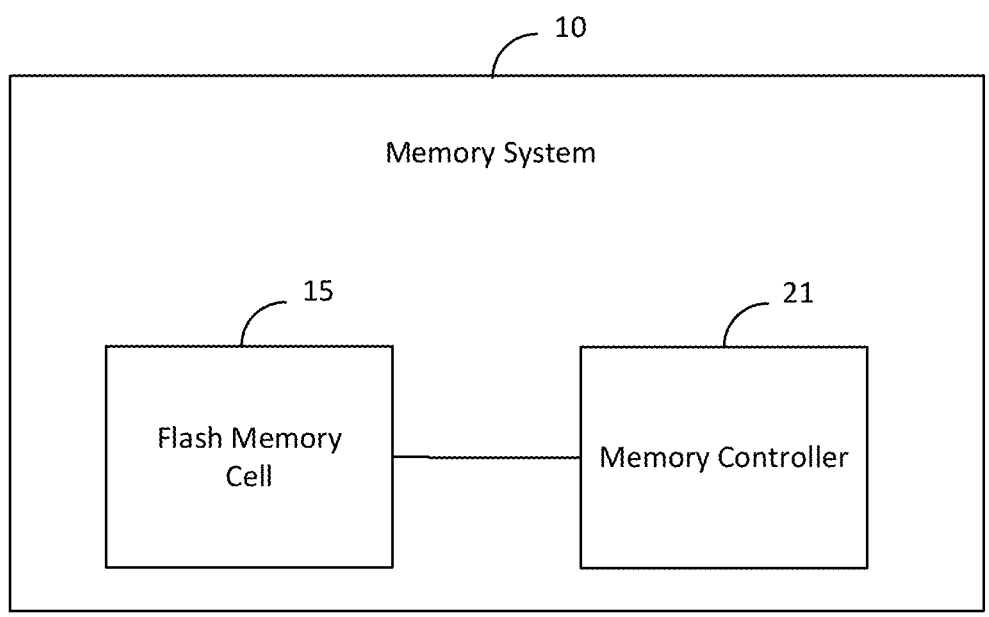
FIG. 1 is a block diagram illustrating an exemplary embodiment of a memory system.

FIG. 1 depicts a flash memory system 10 having at least one flash memory cell 15. In actuality, the memory system 10 may have any number of flash memory cells, but only one cell 15 is shown for simplicity of operation. The flash memory cell 15 may be configured as NOR, NAND, VNAND or other types or arrangements. Unless otherwise indicated, it will be assumed that the memory cell is a NAND flash memory cell, but it should be emphasized that other types of cells are possible. In addition, each cell 10 of the memory system 10 may be configured for storing a desired number of charge states (e.g., bits) per cell, such as single level cell (SLC), multi-level cell (MLC), triple-level cell (TLC) or otherwise.

As shown by FIG. 1, the flash memory cell 15 is coupled to a memory controller 21 that is configured to perform memory operations, such as reading, erasing, and programming (i.e., writing) on the cell 15 through techniques known in the art. The controller 21 may be implemented in hardware or a combination of hardware and software. As an example, the controller 21 may be implemented exclusively in hardware, such a field programmable gate array or other type of circuitry configured to perform memory operations as described herein. In another example, the controller 21 may comprise a processor, such as digital signal processor (DSP) or central processing unit (CPU), that is configured to execute software to perform one or more functions of the controller 21. As known in the art, the controller 21 may be configured to perform memory operations by applying voltages on connections or "lines," such as a word line and a bit line, connected to the memory cell 15 as appropriate for performing the desired operation.

Figure 2:
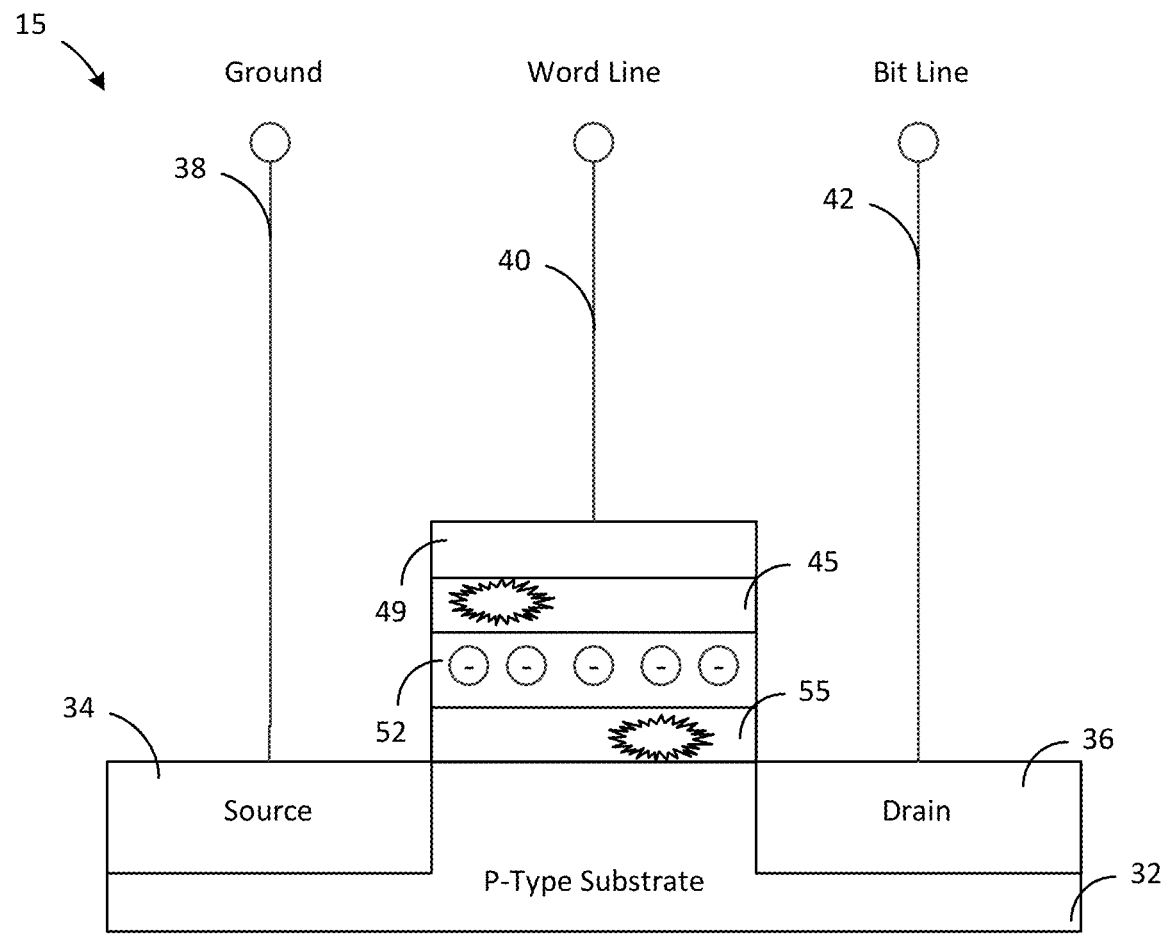
FIG. 2 is a block diagram illustrating an exemplary embodiment of a flash memory cell, such as is depicted by FIG. 2.

FIG. 2 depicts an exemplary embodiment of a flash memory cell 15, such as is depicted by FIG. 1. The memory cell 15 of FIG. 2 is depicted as essentially a standard flash memory cell and has a substrate 32, source 34, drain 36, ground line 38, word line 40, and bit line 42. When the cell 15 is exposed to a radiation dose, the dose may cause damage to each of the blocking oxide 45 below the control gate 49 and tunnel oxide 55 below the floating gate 52. The damage may lead to current leakage from a charge stored on the floating gate 52 (e.g., via damage to the oxide layers 45 and 55). Voltage may be applied to the cell 15 via the lines 38, 40, 42 by the memory controller 21 to perform read/erase/program operations.

In order to harden the flash memory cell 15 to radiation, the controller 21 is configured to induce accelerated aging of the flash memory cell 15 by repetitively performing memory operations on the flash memory cell during a radiation hardening process. In one embodiment, PE cycling is performed by the controller 21, but other types of memory operations are possible in other embodiments. For each cycle, the controller 21 performs a program (i.e., write operation) following by an erase operation. As an example, the controller 21 may write a logical high value (e.g., a "1") in the memory cell 15 and then erase the memory cell 15 to change the value to a logical low (e.g., a "0"). The controller 21 successively repeats this cycle a predefined number of times in order to achieve a desired gaining and thus hardening of the cell 15.

Note that over time, repeated use of the cell 15 by PE cycling or other types of memory operations wears on the cell 15 such that the cell 15 may eventually fail. Thus, the number of PE cycles (or other types of cycles of memory operations) to be performed for the radiation hardening process is selected in an effort to optimize the hardening taking into consideration the wear that the cycling has on the cell 15. Moreover, the optimal number of cycles to be performed for radiation hardening may be empirically determined and may vary from one type of memory to another. Experimental results are presented below for consideration using a 10 kV X-ray source for generating radiation.

EXPERIMENTAL RESULTS

Experimental tests have been performed using commercial off the shelf NAND Flash memory chips of 20 nm technology node from Micron (part #MT29F64G08CBABAWP:B TR) in TSOP (Tape and Reel) package. The chips are of size 64Gb with MLC storage. In the experiments, 100 different blocks were used from different locations of the chip. Each block includes 256 pages of size 8k bytes each. A custom design board is used in order to program and read the Flash chips. The board contains a socket to hold a Flash chip under test, an ARM microprocessor to issue commands and receive data from the Flash chip and a serial interface.

TID tolerance of the Flash chip is evaluated using X-ray irradiation and it is performed using an ARACOR 4100 10-keV X-ray system with a dose rate of 5 krad (SiO2)/min. All terminals of the device under test (DUT) were grounded during exposure. Exposure was performed in the radiation test facility of Vanderbilt University. The HTDR experiments were performed at about 180 degrees Fahrenheit (F) for about 30 minutes. The results of the experiments are generally shown in FIGS. 3a-c and FIGS. 4a-c.

Figure 3C:
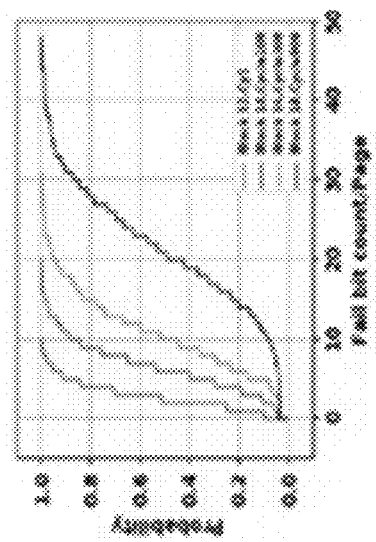
FIG. 3c is a graph illustrating CDF of FBC for 1024 pages after about five minutes of baking at about 180 degrees Fahrenheit (F).
Figure 3B:
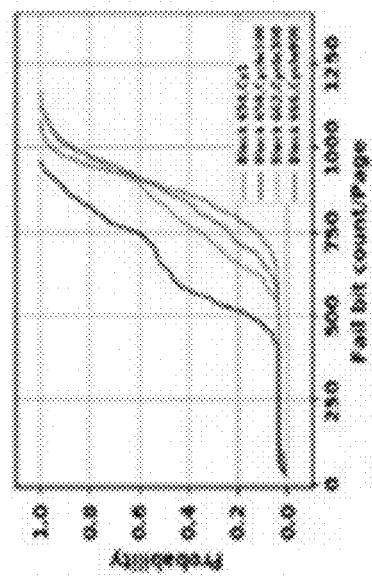
FIG. 3b is a graph illustrating cumulative distribution function (CDF) of failed bit count (FBC) for 1024 pages after 10k rad of X-ray exposure.
Figure 3A:
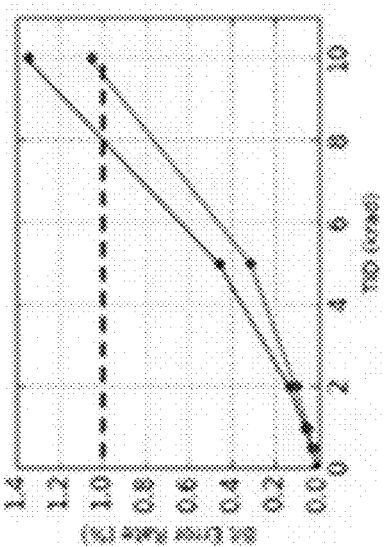
FIG. 3a is a graph illustrating a comparison of bit error rate on fresh verses PE-cycled memory blocks.

In FIG. 3a, the X-ray exposure effect on the fresh memory blocks is compared to the program-erase (PE) cycled blocks of the same chip. In order to evaluate the effect of ionizing radiation, the entire chip is first programmed with a fixed data pattern. Just after the program, the chip is read. As shown, there are very few bits (<10 bits per 8k byte page) in the failed state (usually called failed bit count or FBC) which can be easily corrected by standard ECC (error correction code) engine. As expected, the PE cycled blocks have little more FBC than the fresh ones. However, after radiation exposure, the PE-cycled blocks have much lower FBC compared to fresh blocks for the same amount of radiation measured as ionization dose (TID) in the units of kilo rads (SiO2) shown on the x-axis of FIG. 3a. The results shown in FIG. 3a are not obtained from just few memory pages but are calculated from 1024 pages of size 8k bytes each from different physical location of the chip. For more precise analysis, the cumulative probability distribution function of all the FBC obtained from the 1024 pages in the chip is shown in FIG. 3b, which indicates that PE cycled blocks are much less affected by the ionizing radiation.

It is generally known that repeated program-erase operation (equivalently aging or endurance) on flash memory cells has detrimental effects on the reliability, especially the data retention property of the flash cell. Typically, it is found that multiple program erase operations creates traps in the oxides (both tunnel oxide and blocking oxide) of the FG-MOSFET. The trap sites result in leakage of the stored electrons in the floating gate through trap assisted tunneling which degrades the data retention of the memory. We confirm this result by performing high temperature data retention (HTDR) experiment on the same chip with same PE cycling condition and the results are presented in FIG. 3c. As evident from FIG. 3b and FIG. 3c, HTDR experiment shows completely opposite trend than the X-ray exposure in terms of FBC on fresh vs cycled blocks.

Figures 4A, 4B, 4C:
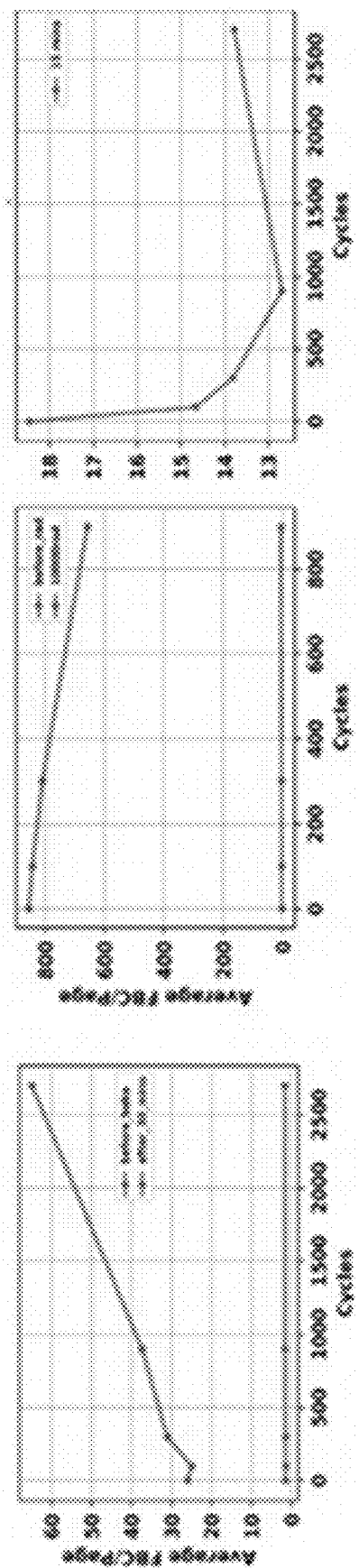
FIG. 4a is a graph illustrating average FBC per page, with respect to PE cycle count on a block (1) after baking it for about 30 minutes at 180 degrees F. and (2) before baking.
FIG. 4b is a graph illustrating average FBC per page, with respect to PE cycles (1) after 10k rad X-ray exposure and (2) before radiation exposure.
FIG. 4c is a graph illustrating average FBC per page, with respect to PE cycles after about 15 minutes, for 70 kV and 0.114 mA.

For more precise comparison between HTDR vs TID on fresh vs cycled blocks, we plot the average FBC for different PE cycle count in FIG. 4a and FIG. 4b. As shown, the cycled blocks are more radiation tolerant compared to fresh blocks whereas opposite trend is observed for HTDR characteristics. As shown in FIG. 4c, the number of cycles if increased after a certain limit, will not have desired properties, which can be used for radiation hardening. It implies that for making a memory rad-hard, it should be cycled optimally. Unconstrained cycling can cause reverse effects.

Figure 5:
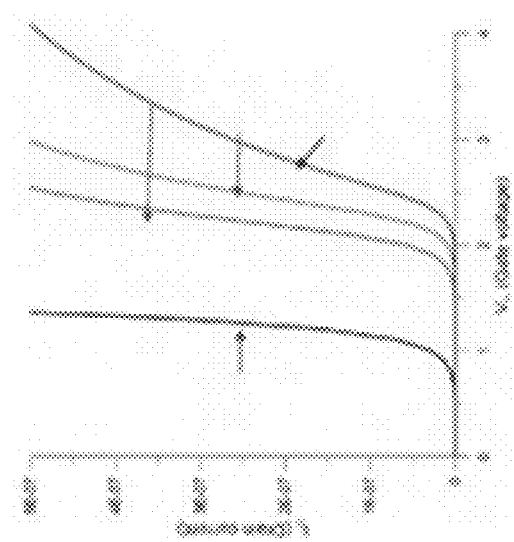
FIG. 5 is a graph illustrating drain current versus gate voltage for (1) erase cell, (2) program cell, (3) fresh blocks after radiation, and (4) PE-cycled blocks after radiation.

FIG. 5 shows the simulated current-voltage characteristics for a Flash cell. Simulation is performed using the Synopsys tool Medici. We introduce trap charge in the oxides to emulate the effects of PE cycling. The simulation shows that electron trapping in the oxide helps to minimize Vt downshift due to TID. On the PE cycled blocks number of electron traps will be more in oxide which can trap the radiation generated electrons. These trapped electrons minimize the effect of charge loss from the floating gate. In the case of HDTR, those traps act as the leakage path for the stored electrons in floating gate. However, in case of radiation exposure, those traps are favorable, and as the traps are increased effective charge loss is less.

From the results obtained, it can be concluded that the commercial MLC (multi-level cell) NAND Flash chip can be made radiation hard by controlled aging. With TID experiments (performed with 10 kV X-ray source), it has been shown that the techniques described herein can improve radiation tolerance of the flash chip by more than 25%. It is believed that the program-erase cycling induced trap states in the tunnel oxides are the key reason for improved ionizing radiation tolerance. Numerical simulation of flash cell using Synopsys tool (Medici) also proved the hypothesis that trap states created in the tunnel oxide helps to minimize the TID effects is strong.

Now, therefore, the following is claimed:

1. A method, comprising:
   selecting a number of program-erase (PE) cycles for use in a radiation hardening process to achieve a desired amount of radiation hardening for the flash memory; and
   performing the radiation hardening process on a cell of flash memory based on the selecting, wherein the performing the radiation hardening process comprises:
      successively performing program-erase (PE) cycles on the cell with a controller for the selected number of PE cycles, wherein for each of the PE cycles, the controller performs a program operation and an erase operation on the cell.

2. The method of claim 1, wherein the cell is a NAND flash memory cell.

* * * * *